(12) United States Patent
Lin et al.

(10) Patent No.: US 7,459,953 B1
(45) Date of Patent: Dec. 2, 2008

(54) VOLTAGE ADJUSTING CIRCUIT

(75) Inventors: Meng-Yong Lin, Taipei (TW);
Bo-Chang Wu, Taichung County (TW);
Ming-Huang Liu, Taipei Hsien (TW);
Chi-Mo Huang, Hsin-Chu (TW)

(73) Assignee: ILI Technology Corp., Jhubei, Hsinchu County (TW)

( * ) Notice: Subject to any disclaimer, the term of this patent is extended or adjusted under 35 U.S.C. 154(b) by 0 days.

(21) Appl. No.: 11/838,863

(22) Filed: Aug. 14, 2007

(51) Int. Cl.
*H03K 17/687* (2006.01)
*H03K 5/08* (2006.01)

(52) U.S. Cl. .................. 327/309; 327/442; 327/313; 327/437

(58) Field of Classification Search .................. 327/313, 327/309, 315, 442, 437, 530
See application file for complete search history.

(56) References Cited

U.S. PATENT DOCUMENTS 6,577,480 B1 * 6/2003 Avery et al. .................... 361/56
6,985,019 B1 * 1/2006 Zhou et al. .................. 327/309

* cited by examiner

*Primary Examiner*—Dinh T. Le
(74) *Attorney, Agent, or Firm*—Winston Hsu

(57) ABSTRACT

The present invention discloses a voltage adjusting circuit including a first switch element, a second switch element, a third switch element, a fourth switch element, a fifth switch element, and a sixth switch element. At first, the voltage adjusting circuit performs a discharging operation on an output voltage toward a reference voltage source, and then when the output voltage level is approaching a voltage level of an input voltage source, the voltage adjusting circuit will perform the discharging operation on the output voltage toward the input voltage source instead, and thus the voltage adjusting circuit can avoid affecting the input voltage source when performing the discharging operation. In addition, the voltage adjusting circuit does not need a digital counter to perform the above dual-phase type discharging operation or multi-phase type discharging operation, and therefore cost of the voltage adjusting circuit is lower, and the voltage adjusting circuit has good accuracy.

10 Claims, 4 Drawing Sheets

VOLTAGE ADJUSTING CIRCUIT

BACKGROUND OF THE INVENTION

1. Field of the Invention

The present invention relates to a voltage adjusting circuit, and more particularly, to a discharging circuit which can avoid affecting an input voltage source when a level pull-up circuit performs a discharging operation, wherein the discharging circuit only requires a simple circuit scheme to be applied to the level pull-up circuit.

2. Description of the Prior Art

In general, there are mainly two kinds of discharging schemes of the conventional discharging circuit. Please refer to FIG. 1. FIG. 1 shows a simplified diagram of a first kind of conventional discharging circuit 10 in accordance with the prior art. As shown in FIG. 1, the discharging scheme of the conventional discharging circuit 10 performs the discharging operation on an output voltage Vout of the discharging circuit 10 directly toward an input voltage source Vin of the discharging circuit 10 by turning on (i.e. conducting) a switch element 12. Although the discharging circuit 10 does not need a complex circuit design, when the voltage difference between the output voltage Vout and the input voltage source Vin exceeds a specific value, the discharging circuit 10 may seriously affect the input voltage source Vin while performing the discharging operation.

Please refer to FIG. 2. FIG. 2 shows a simplified diagram of a second kind of conventional discharging circuit 100 in accordance with the prior art. As shown in FIG. 2, the conventional discharging circuit 100 includes a first switch element 110, a second switch element 120, and a digital counter 130. The discharging scheme of the conventional discharging circuit 100 performs the discharging operation on an output voltage Vout of the discharging circuit 100 toward a reference voltage source Vr (such as the ground voltage level 0) of the discharging circuit 10 at first by using the digital counter 130 for turning on (i.e. conducting) the first switch element 110. After a specific period, the digital counter 130 will turn off (i.e. not conduct) the first switch element 110, and turn on the second switch element 120 to perform the discharging operation on the output voltage Vout of the discharging circuit 100 toward an input voltage source Vin of the discharging circuit 100 then. Although the discharging circuit 100 does not seriously affect the input voltage source Vin while performing the discharging operation like the discharging circuit 10 shown in FIG. 1, since the specific period which the digital counter 130 switches states of the first switch element 110 and the second switch element 120 according to is determined by experience rules, the accuracy will be affected by many factors frequently and thus the accuracy is not good enough. In addition, a logic circuit is required when designing the conventional discharging circuit 100, and thus the discharging circuit 100 needs a larger circuit layout area. Therefore, cost of the conventional discharging circuit 100 is also higher.

SUMMARY OF THE INVENTION

It is therefore one of the objectives of the present invention to provide a discharging circuit which can avoid affecting an input voltage source when a level pull-up circuit performs a discharging operation wherein the discharging circuit only requires a simple circuit scheme to be applied to the level pull-up circuit, so as to solve the above problem.

According to an embodiment of the present invention, a voltage adjusting circuit is disclosed. The voltage adjusting circuit includes: a first switch element, a second switch element, a third switch element, a fourth switch element, a fifth switch element, and a sixth switch element. The first switch element has a control terminal coupled to a first control signal, a first terminal coupled to a first voltage source, and a second terminal coupled to a first node. The second switch element has a control terminal coupled to a second control signal, a first terminal coupled to a second node, and a second terminal coupled to the first node, wherein the second node is an output terminal of the voltage adjusting circuit and is utilized for outputting an output voltage according to the first voltage source. The third switch element has a control terminal coupled to the first node, a first terminal coupled to the second node, and a second terminal coupled to a third node. The fourth switch element has a control terminal coupled to a third control signal, a first terminal coupled to a second voltage source, and a second terminal coupled to the third node. The fifth switch element has a control terminal coupled to the second control signal, a first terminal coupled to the second node, and a second terminal coupled to the third node. The sixth switch element has a control terminal coupled to the third node, a first terminal coupled to the second node, and a second terminal coupled to the first voltage source.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and the claims to refer to particular system components. As one skilled in the art will appreciate, manufacturers may refer to a component by different names. This document does not intend to distinguish between components that differ in name but not function. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Figure 3:
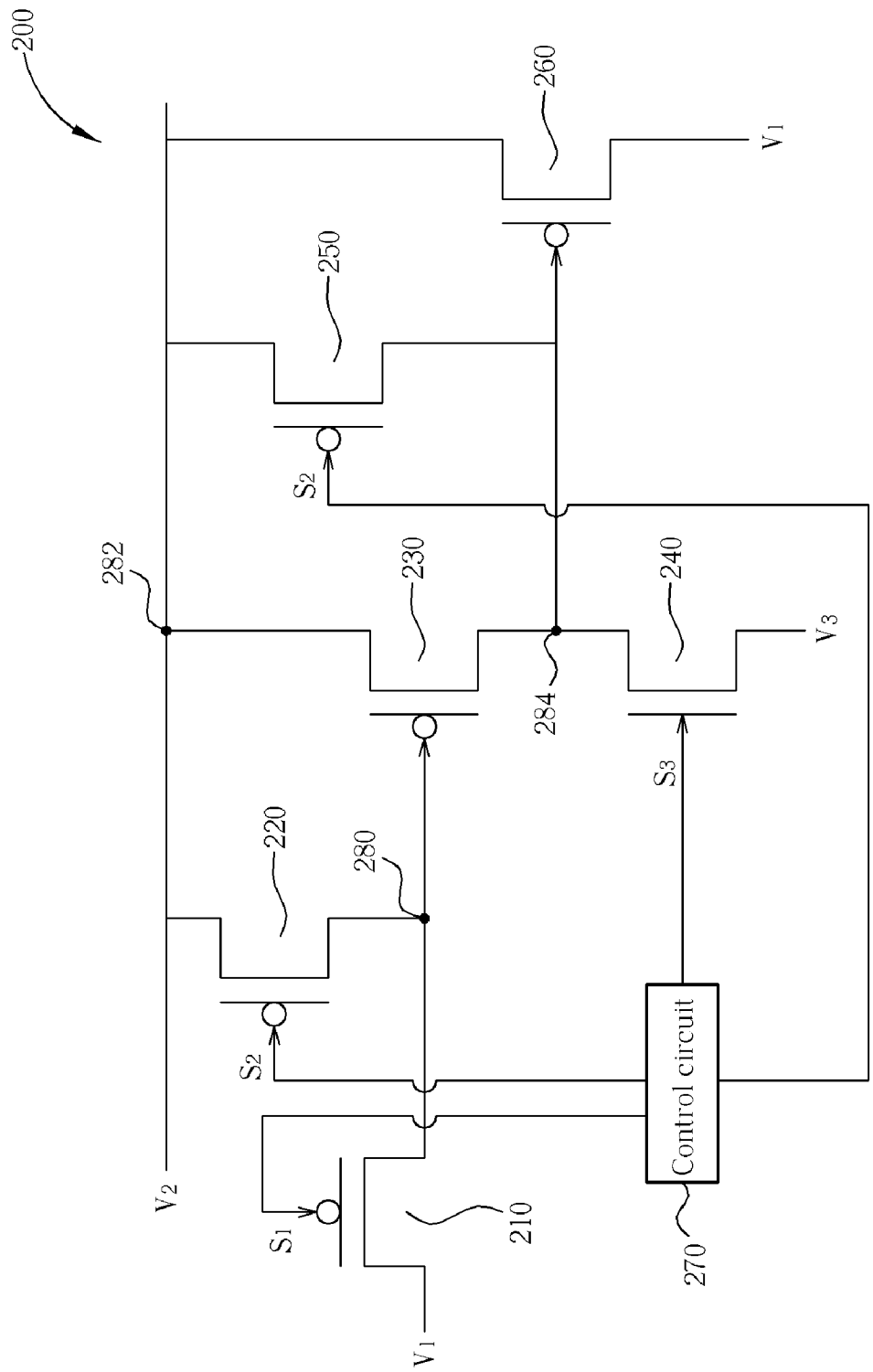
FIG. 3 shows a simplified diagram of a discharging circuit in accordance with an embodiment of the present invention.

Please refer to FIG. 3. FIG. 3 shows a simplified diagram of a discharging circuit 200 in accordance with an embodiment of the present invention. As shown in FIG. 3, the discharging circuit 200 includes a first switch element 210, a second switch element 220, a third switch element 230, a fourth switch element 240, a fifth switch element 250, a sixth switch element 260, and a control circuit 270, wherein the first switch element 210, the second switch element 220, the third switch element 230, the fifth switch element 250, and the sixth switch element 260 all are P-type FETs (such as PMOS-FETs), and the fourth switch element 240 is an N-type FET (such as NMOSFET). The control circuit 270 is utilized for generating a first control signal S1, a second control signal S2, and a third control signal S3, wherein the first control signal S1 and the second control signal S2 are control voltage source signals having reverse phases, and the first control signal S1 and the third control signal S3 are control voltage source signals having different voltage levels and reverse phases. The first switch element 210 has a control terminal (i.e. a gate terminal) coupled to a first control signal S1, a first terminal (i.e. a source terminal) coupled to a first voltage source (i.e. an input voltage source) V1, and a second terminal (i.e. a drain terminal) coupled to a first node 280. The second switch element 220 has a control terminal (i.e. a gate terminal) coupled to a second control signal S2, a first terminal (i.e. a source terminal) coupled to a second node 282, and a second terminal (i.e. a drain terminal) coupled to the first node 280, wherein the second node 282 is an output terminal of the voltage adjusting circuit and is utilized for outputting an output voltage V2 according to the first voltage source V1. The third switch element 230 has a control terminal (i.e. a gate terminal) coupled to the first node 280, a first terminal (i.e. a source terminal) coupled to the second node 282, and a second terminal (i.e. a drain terminal) coupled to a third node 284. The fourth switch element 240 has a control terminal (i.e. a gate terminal) coupled to a third control signal S3, a first terminal (i.e. a source terminal) coupled to a second voltage source (i.e. a reference voltage source) V3, and a second terminal (i.e. a drain terminal) coupled to the third node 284, wherein the voltage level of the second voltage source V3 can be a ground voltage level (i.e. V3=0) for example, but it is not meant to be a limitation of the present invention. In addition, please note that the aspect ratio of the third switch element 230 is set to be greater than that of the fourth switch element 240 in the present invention. Next, the fifth switch element 250 has a control terminal (i.e. a gate terminal) coupled to the second control signal S2, a first terminal (i.e. a source terminal) coupled to the second node 282, and a second terminal (i.e. a drain terminal) coupled to the third node 284. The sixth switch element 260 has a control terminal (i.e. a gate terminal) coupled to the third node 284, a first terminal (i.e. a source terminal) coupled to the second node 282, and a second terminal (i.e. a drain terminal) coupled to the first voltage source V1. Please note that the above embodiment is only for an illustrative purpose and is not meant to be a limitation of the present invention. Next, this document will illustrate the details of the discharging scheme of the discharging circuit 200 of this embodiment in the following paragraphs.

Figure 1:
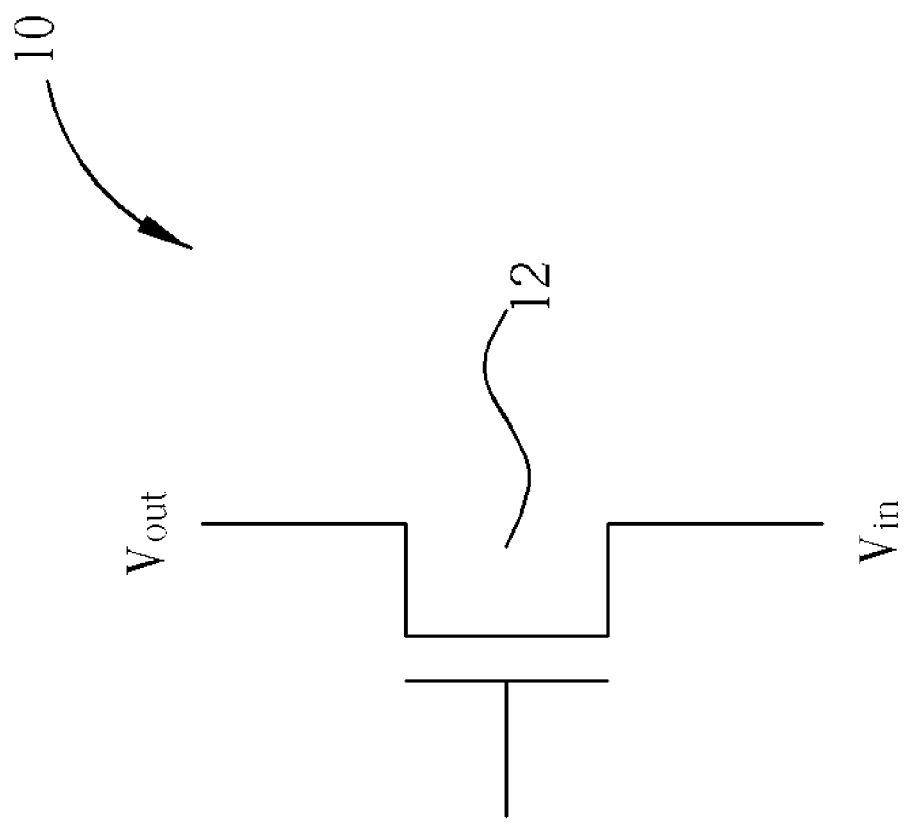
FIG. 1 shows a simplified diagram of a first kind of conventional discharging circuit in accordance with the prior art.
Figure 2:
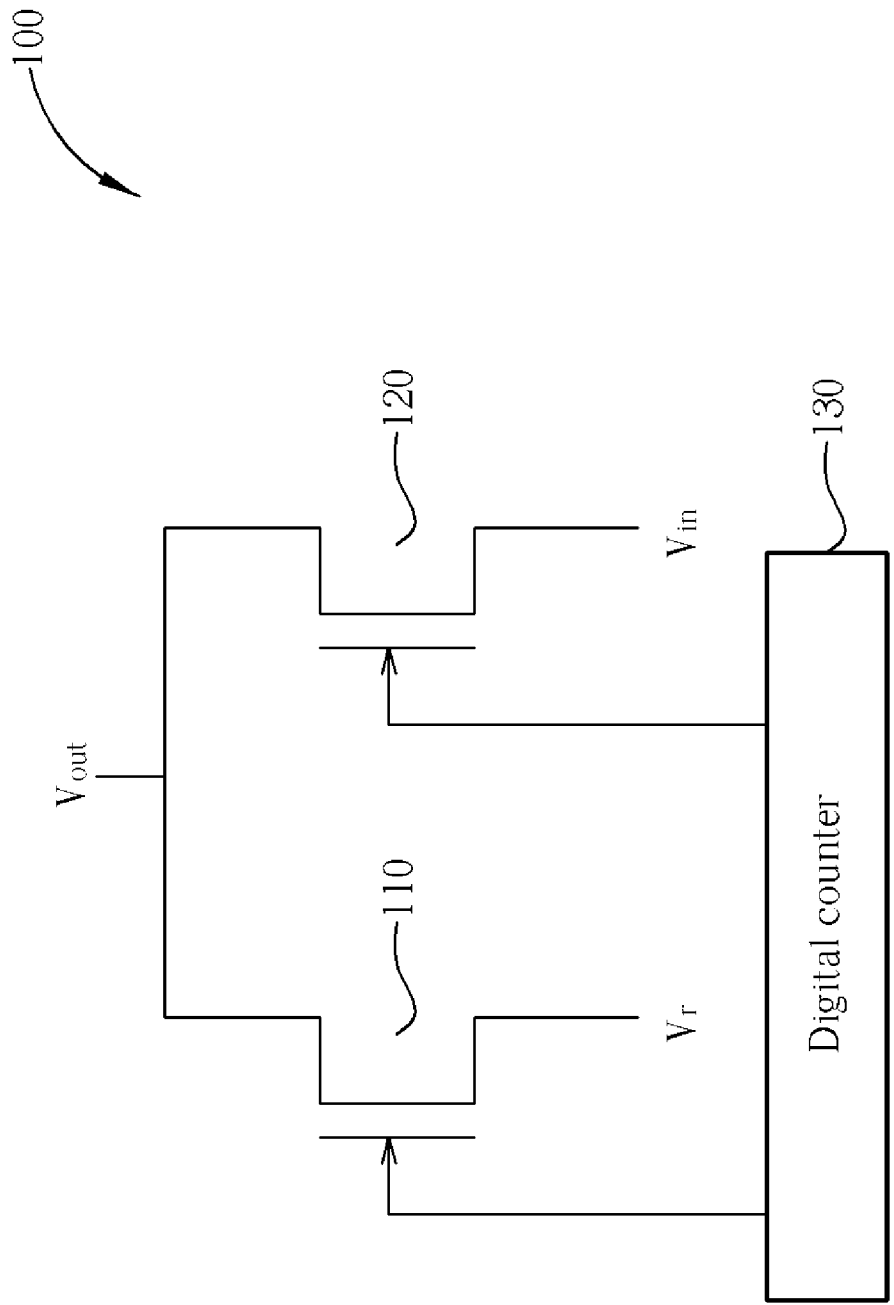
FIG. 2 shows a simplified diagram of a second kind of conventional discharging circuit in accordance with the prior art.
Figure 4:
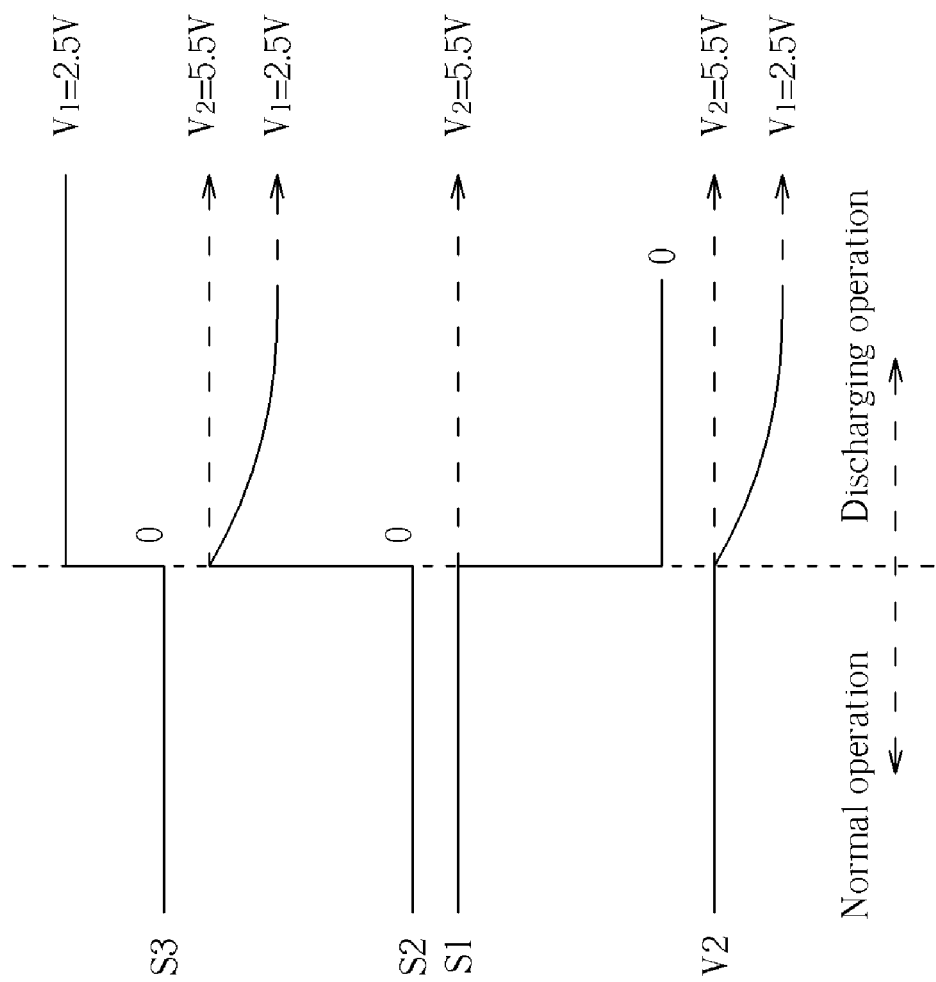
FIG. 4 shows a simplified timing diagram of an embodiment about the first control signal S1, the second control signal S2, the third control signal S3, and the output voltage V2 when the discharging circuit shown in FIG. 3 performs a normal operation and a discharging operation.

Please refer to FIG. 4. FIG. 4 shows a simplified timing diagram of an embodiment about the first control signal S1, the second control signal S2, the third control signal S3, and the output voltage V2 when the discharging circuit 200 shown in FIG. 3 performs a normal operation and a discharging operation. This embodiment presumes that the first voltage source V1=2.5V, the output voltage V2=5.5V, and the first control signal S1 and the second control signal S2 are control voltage source signals whose high level is V2, and the third control signal S3 is a control voltage source signal whose high level is V1. Please note that the above embodiment is only for an illustrative purpose and is not meant to be a limitation of the present invention. As shown in FIG. 2, when the voltage adjusting circuit 200 operates during a normal operation period, the control circuit 270 sets the first control signal S1 to turn off (i.e. not conduct) the first switch element 210, and sets the second control signal S2 to turn on (i.e. conduct) the second switch element 220 and the fifth switch element 250, and sets the third control signal S3 to turn off the fourth switch element 240. Thus, it is obvious that the third switch element 230 and the sixth switch element 260 will be turned off under this condition.

When the voltage adjusting circuit 200 starts to perform the discharging operation, the control circuit 270 sets the first control signal S1 to turn on the first switch element 210, and sets the second control signal S2 to turn off the second switch element 220 and the fifth switch element 250, and sets the third control signal S3 to turn on the fourth switch element 240. Meanwhile, since the voltage difference between the second node 282 and the first node 280 will increase and exceed the threshold voltage of the third switch element 230, the third switch element 230 will be turned on. On the other hand, since the aspect ratio of the third switch element 230 is greater than that of the fourth switch element 240, it is obvious that the sixth switch element 260 will be turned off under this condition. In this way, the voltage level of the output voltage V2 will be pulled down toward the voltage level of the second voltage source V3 (i.e. the ground voltage level 0) in this stage. In addition, please note that when the voltage adjusting circuit 200 performs the discharging operation, the control circuit 270 will lower the output voltage level of the second control signal S2 according to a descending curve of the voltage level of the second control signal S2, and the second switch element 220 and the fifth switch element 250 will still remain in the turned-off state.

When the voltage adjusting circuit 200 performs the discharging operation until the voltage level of the output voltage V2 gradually becomes close to the voltage level of the first voltage source V1, the first switch element 210 and the fourth switch element 240 will still remain in the original turned-on state, and the second switch element 220 and the fifth switch element 250 will still remain in the original turned-off state. However, since the voltage difference between the second node 282 and the first node 280 will gradually become close to the voltage level of the first voltage source V1 and then become lower than the threshold voltage of the third switch element 230, the third switch element 230 will be turned off. On the other hand, since the third node 284 will be pulled to the voltage level of the second voltage source V3 to make the voltage difference between the second node 282 and the third node 284 exceed the threshold voltage of the sixth switch element 260 after the third switch element 230 is turned off, the sixth switch element 260 will be turned on. In this way, the voltage level of the output voltage V2 will be equal to or quite close to the voltage level of the first voltage source V1 in the end.

Briefly summarized, the voltage adjusting circuit disclosed by the present invention (such as the discharging circuit in the above embodiment) is not like the discharging scheme of the conventional discharging circuit that performs the discharging operation on an output voltage directly toward an input voltage source. The voltage adjusting circuit of the present invention firstly performs a discharging operation on an output voltage toward a reference voltage source (such as the ground voltage level 0), and then when the output voltage level is approaching a voltage level of an input voltage source, the voltage adjusting circuit will perform the discharging operation on the output voltage toward the input voltage source instead, and thus the voltage adjusting circuit can avoid affecting the input voltage source when performing the discharging operation. In addition, the voltage adjusting circuit of the present invention does not need a digital counter to perform the above dual-phase type discharging operation or multi-phase type discharging operation while another discharging scheme of the conventional discharging circuit uses the digital counter. Thus, the voltage adjusting circuit of the present invention does not need a logic circuit and does not need a larger circuit layout area which the conventional discharging circuit including the digital counter needs. Therefore, cost of the voltage adjusting circuit of the present invention will be lower and have excellent accuracy.

Those skilled in the art will readily observe that numerous modifications and alterations of the device and method may be made while retaining the teachings of the invention.

What is claimed is:

1. A voltage adjusting circuit, comprising:
    a first switch element, having a control terminal coupled to a first control signal, a first terminal coupled to a first voltage source, and a second terminal coupled to a first node;
    a second switch element, having a control terminal coupled to a second control signal, a first terminal coupled to a second node, and a second terminal coupled to the first node, wherein the second node is an output terminal of the voltage adjusting circuit, for outputting an output voltage according to the first voltage source;
    a third switch element, having a control terminal coupled to the first node, a first terminal coupled to the second node, and a second terminal coupled to a third node;
    a fourth switch element, having a control terminal coupled to a third control signal, a first terminal coupled to a second voltage source, and a second terminal coupled to the third node;
    a fifth switch element, having a control terminal coupled to the second control signal, a first terminal coupled to the second node, and a second terminal coupled to the third node; and
    a sixth switch element, having a control terminal coupled to the third node, a first terminal coupled to the second node, and a second terminal coupled to the first voltage source.

2. The voltage adjusting circuit of claim 1, wherein the first, second, third, fourth, fifth, and sixth switch elements all are transistors.

3. The voltage adjusting circuit of claim 2, wherein an aspect ratio of the third switch element is greater than an aspect ratio of the fourth switch element.

4. The voltage adjusting circuit of claim 2, wherein the first, second, third, fifth, and sixth switch elements all are P-type FETs, and the fourth switch element is an N-type FET.

5. The voltage adjusting circuit of claim 4, further comprising:
    a control circuit, for generating the first, second, and third control signals, wherein the control circuit sets a voltage level of the first control signal not conducting the first switch element to be higher than a voltage level of the third control signal conducting the fourth switch element.

6. The voltage adjusting circuit of claim 1, being a discharging circuit.

7. The voltage adjusting circuit of claim 6, wherein the first voltage source is an input voltage source, the second voltage source is a reference voltage source, and a voltage level of the input voltage source is higher than a voltage level of the reference voltage source.

8. The voltage adjusting circuit of claim 7, further comprising:
    a control circuit, for generating the first, second, and third control signals, wherein when the voltage adjusting circuit operates during a normal operation period, the control circuit sets the first control signal to not conduct the first switch element, sets the second control signal to conduct the second and fifth switch elements, and sets the third control signal to not conduct the fourth switch element; and when the voltage adjusting circuit performs a discharging operation, the control circuit sets the first control signal to conduct the first switch element, sets the second control signal to not conduct the second and fifth switch elements, and sets the third control signal to conduct the fourth switch element.

9. The voltage adjusting circuit of claim 8, wherein when the voltage adjusting circuit performs the discharging operation, the control circuit gradually lowers a voltage level of the second control signal.

10. The voltage adjusting circuit of claim 7, wherein the voltage level of the reference voltage source is a ground voltage level.

* * * * *